(12) United States Patent
Bowers et al.

(10) Patent No.: US 8,700,845 B1
(45) Date of Patent: Apr. 15, 2014

(54) DAISY CHAINING NONVOLATILE MEMORIES

(75) Inventors: Stephen Wilbur Bowers, Woodland, CA (US); Joseph Douglas Edgington, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 542 days.

(21) Appl. No.: 12/539,771

(22) Filed: Aug. 12, 2009

(51) Int. Cl.
G06F 12/00 (2006.01)

(52) U.S. Cl.
USPC .................................. 711/110; 711/E12.001

(58) Field of Classification Search
None
See application file for complete search history.

(56) References Cited

U.S. PATENT DOCUMENTS

| | | | |
|---|---|---|---|
| 3,413,606 A * | 11/1968 | Cichanowicz et al. ...... | 340/3.53 |
| 3,413,607 A * | 11/1968 | Fine .............................. | 340/3.52 |
| 3,809,820 A * | 5/1974 | Sullivan ........................ | 370/537 |
| 4,270,150 A * | 5/1981 | Diermann et al. ............ | 386/202 |
| 4,332,011 A * | 5/1982 | Epstein et al. .................. | 710/42 |
| 4,477,847 A * | 10/1984 | Knight et al. ................... | 360/60 |
| 5,023,778 A * | 6/1991 | Simon et al. .................. | 709/209 |
| 5,182,707 A * | 1/1993 | Cooper et al. ................ | 422/404 |
| 5,589,787 A * | 12/1996 | Odinot .......................... | 327/202 |
| 5,596,724 A * | 1/1997 | Mullins et al. .................. | 710/71 |
| 5,784,573 A * | 7/1998 | Szczepanek et al. ......... | 709/250 |
| 5,966,723 A * | 10/1999 | James et al. .................. | 711/103 |
| 6,128,311 A * | 10/2000 | Poulis et al. .................. | 370/463 |
| 6,202,110 B1 * | 3/2001 | Coteus et al. ................. | 710/301 |
| 2001/0009424 A1 * | 7/2001 | Sekiguchi ..................... | 345/740 |
| 2007/0016720 A1 * | 1/2007 | Cohen ........................... | 711/103 |
| 2007/0076502 A1 * | 4/2007 | Pyeon et al. .................. | 365/221 |
| 2008/0273475 A1 * | 11/2008 | Priyantha et al. ............. | 370/257 |
| 2009/0063786 A1 * | 3/2009 | Oh ................................. | 711/148 |

* cited by examiner

*Primary Examiner* — Matthew Bradley
*Assistant Examiner* — Daniel Bernard
(74) *Attorney, Agent, or Firm* — Schwegman, Lundberg & Woessner, P.A.

(57) ABSTRACT

A host accessing memory devices by providing common address and command information on a parallel-connected serial bus to each of the memory devices and shifting data in the memory devices through a daisy-chain serial interface.

13 Claims, 2 Drawing Sheets

DAISY CHAINING NONVOLATILE MEMORIES

BACKGROUND OF THE INVENTION

The term cloud is a metaphor for the Internet and is an abstraction for the complex infrastructure it conceals. The cloud computing infrastructure consists of reliable services delivered through data centers where computing power is shared among multiple tenants, servers are fully utilized, and costs are significantly reduced. Each physical server is coupled to physical resources including a network resource for interfacing the network system, and each physical server includes data storage that may include both volatile and nonvolatile resources. Typically, the data storage are serialized devices using exorbitant amounts of time propagating or inputting addresses through an address chain. Additional improvements are needed to improve response times from data storage infrastructures.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
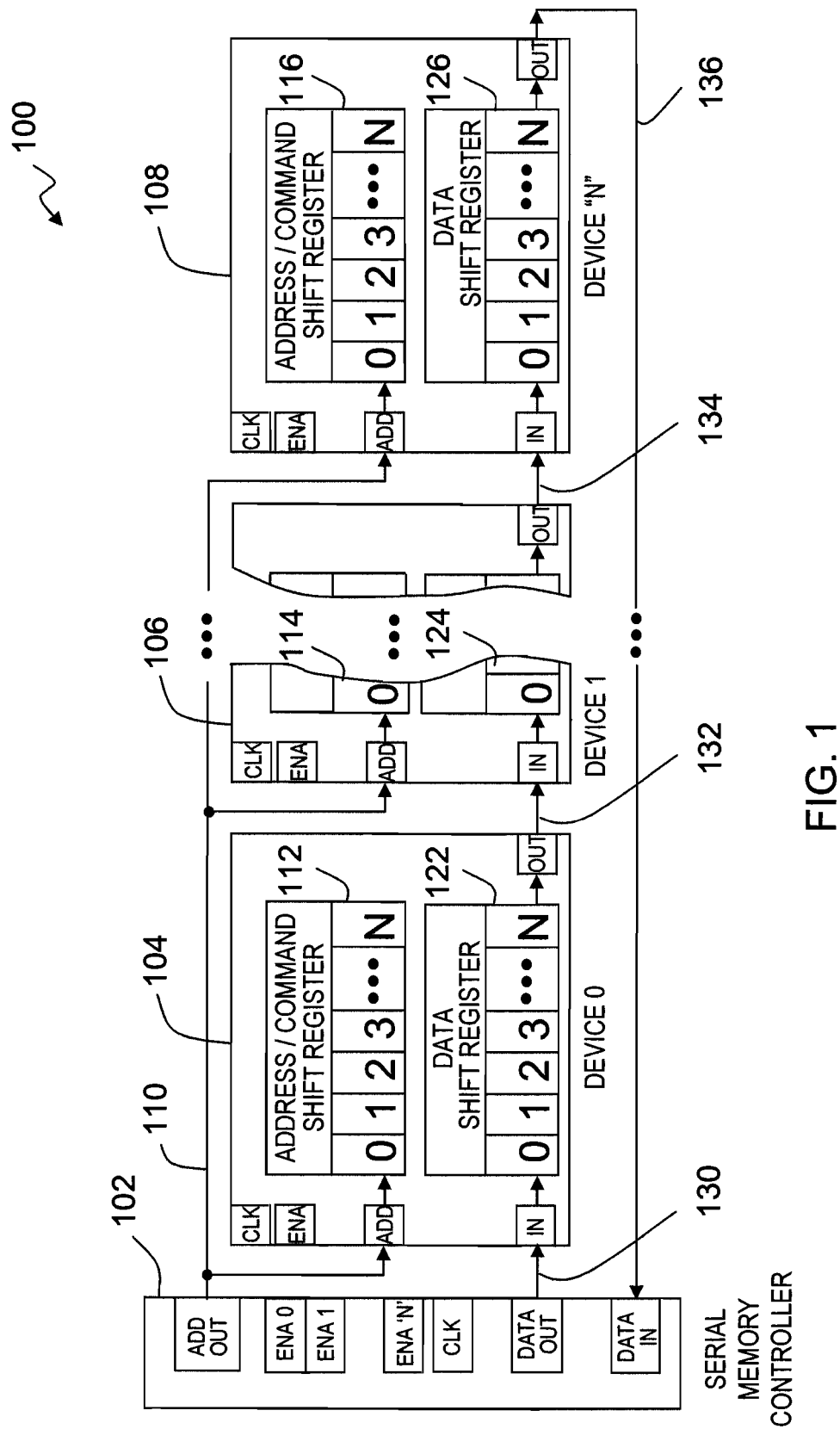
FIG. 1 is an embodiment that includes a parallel-connected address/command electrical path and a serial-connected electrical path for data to various memory devices in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

Cloud computing incorporates the fundamental building blocks used in computing and refers to both the applications delivered as services over the Internet and the hardware and systems software in the data centers that provide those services. It is no longer necessary for the processing device to have the power or the hard disk space demanded by the traditional desktop PC when running web-based applications in the cloud environment.

Cloud computing offers collaboration and document sharing through computer connections to the Internet. With web-based applications, documents are available with the virtually limitless storage in the cloud. FIG. 1 illustrates memory devices that may be used in these high-density memory systems, where an address/command path and a data path in the memory devices are connected in accordance with features of the present invention to reduce system cost and complexity.

Various memory interfaces allow low pin-count packages which occupy less board space and lower total system costs. One such interface is a four-wire Serial Peripheral Interface (SPI) that allows application-specific controllers to execute code directly from serial memory. Another interface, the I2C bus transmits data and clock with Serial Data (SDA) and Serial Clock (SCL) from an I2C master to slave devices. A Joint Test Action Group (JTAG) interface allows communication to an external device for programming of memory. These memory interfaces are provided as examples and the present invention is not limited to these interfaces.

In various embodiments, the memory devices may use different process technologies and metallurgical combinations to implement nonvolatile characteristics and provide long lifetimes, low power, and high memory density. In one embodiment, the nonvolatile memory may use Phase-Change Memory (PCM) arrays having alloys of elements such as Te or Se that are referred to as chalcogenides or chalcogenic materials. The PCM arrays may also be referred to as Phase-Change Random Access Memory (PRAM or PCRAM), Ovonic Unified Memory (OUM) or Chalcogenide Random Access Memory (C-RAM).

In another embodiment the memory arrays may be Magnetic Random Access Memory (MRAM) cells where magnetic storage elements are formed from two ferromagnetic plates located at an intersection of a row and column line and selected by a Magnetic Tunnel Junction (MTJ) device. In yet another embodiment, the memory arrays may be Ferroelectric Random Access Memory (FRAM) cells that include ferroelectric material. Alternatively, the nonvolatile memory may include Programmable Metallization Cells (PMC) that are based on two solid metal electrodes and a thin film of electrolyte between them, alternatively referred to as Conductive-Bridging RAM, or CBRAM.

As shown in FIG. 1, a number of "N" memory devices may be connected in a chain topology. A host controller 102 is connected to memory device 104, which in turn is chained to memory device 106, with additional memory devices extending the chain to the final Nth device, i.e., memory device 108. The number of memory devices 104, 106, . . . , 108 in the memory chain depends on the initial latency in the system requirements.

A serial memory controller architecture 100 has separate electrical paths for data and address/commands to the various serial memory devices 104, 106, . . . , 108 in the system. Thus, this embodiment removes the address from the serializing chain. Specifically, an Address/Command Shift Register 112 in memory device 104, Address/Command Shift Register 114 in memory device 106, . . . , and Address/Command Shift Register 116 in memory device 108 all have inputs connected in parallel to address/command path 110. Thus, address/command path 110 allows for all memory devices to receive the same address and command information without incurring the pipelining delay that is inherent in prior art daisy-chain configurations for serial memory devices.

The figure also shows a daisy-chain data path 130, 132, . . ., 134 that allows for data-bits to be clocked through a low pin-count serial interface. Memory controller 102 supplies data bits to an input of Data Shift Register 122 via data path 130. An output of Data Shift Register 122 is coupled to an input of Data Shift Register 124 via data path 132. Further in the chain, an output from a previous Data Shift Register is coupled to an input of Data Shift Register 126 via data path 134. The data output of the data shift register 126 in memory device 108 is connected to a DATA In of serial memory controller 102 via path 136. Thus, the figure illustrates a two-pin scheme for memory devices but it should be noted that a bidirectional, single-pin serial interface may be used.

The physical interface includes the single ADDRESS pin (ADD OUT) that provides serially loaded addresses during data accesses. The ADD OUT pin may operate in two modes; the first mode sets the ADD OUT pin to provide addresses/commands simultaneously with activity on the IO Data pin, and the second mode where the ADD OUT pin does not function simultaneously with activity on the IO Data pin. It should be noted that the clocking of address and commands on the address/command path 110 into Address/Command Shift Registers 112, 114, . . . , 116 may be at a clock frequency that is different than the clocking for the data in Data Shift Registers 122, 124, and 126. In fact, the I/O pins in serial memory controller architecture 100 only incur electrical loading, and therefore, the data paths 130, 132, 134, . . . , 136 may be operated at a greater frequency than the heavily loaded address/command pin that supplies address/command path 110.

Figure 2:
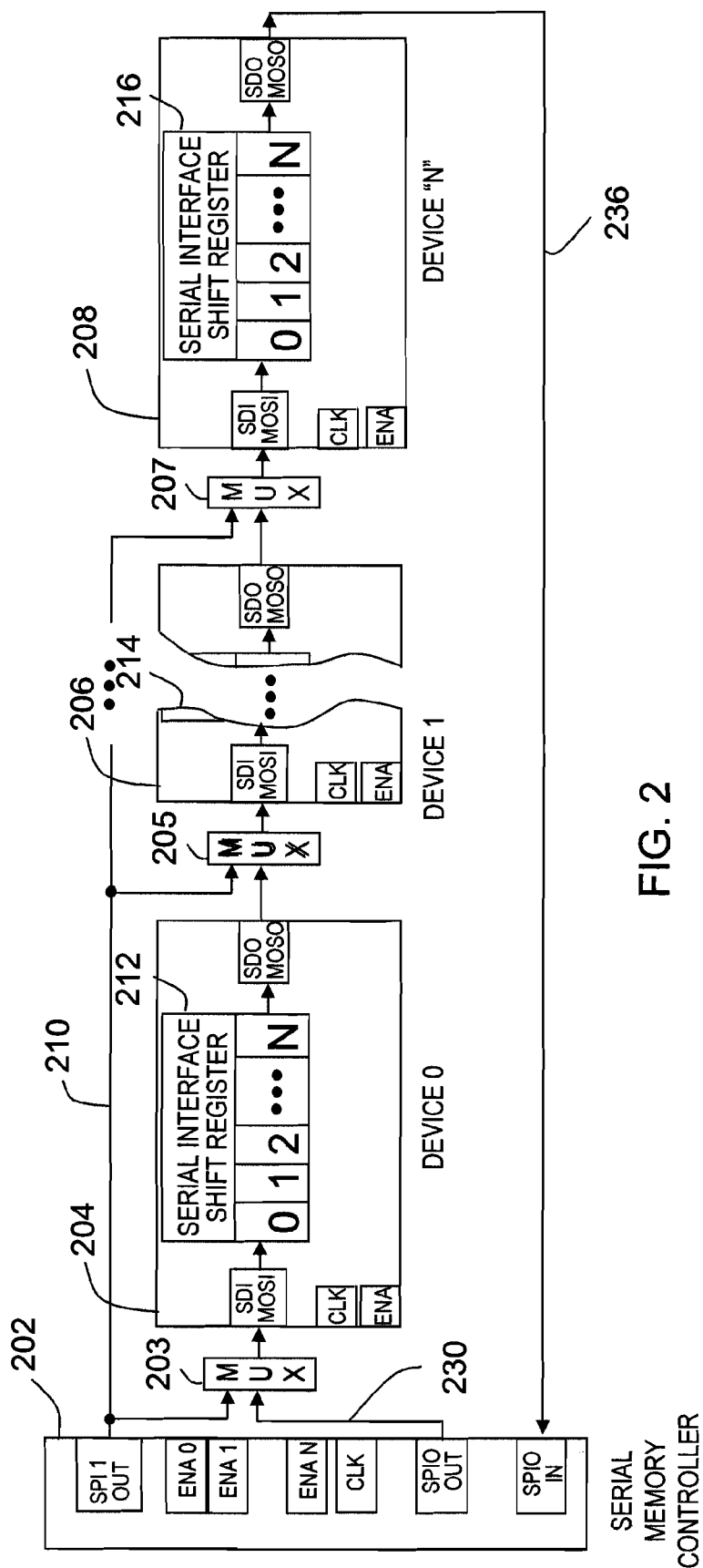
FIG. 2 is an embodiment that utilizes multiplexers (MUXs) and Electronic switches to temporarily remove addresses from a serializing chain to memory devices for small periods of time in accordance with the present invention.

FIG. 2 illustrates an embodiment that utilizes multiplexers (MUXs) and Electronic switches such as, for example, transceiver/bus switches. The multiplexers and Electronic switches are used to temporarily remove addresses from a serializing chain for small periods of time. During the time that the chain is disconnected, multiplexers select an address that is simultaneously provided to each memory device in the chain. After the address has been shifted into each of the memory devices, the switches again reconnect all memory devices back into a chain configuration to allow data to be serially transmitted through the chain.

As shown in the figure, a Serial Memory Controller 202 provides an address/command serial bus 210 as a SPI (serial protocol) buss and a data bus 230 as a separate bus. Multiplexers (MUXs) placed on the serial input of the memory devices allow selection of the serial data source as either the parallel-connected serial master, i.e., bus 210, or the daisy-chain configuration serial master, i.e., bus 230. During the time period that the serial input of the memory devices are parallel-connected, MUX 203 selects address/command serial bus 210 as the input to Serial Interface Shift Register 212 in memory device 204; MUX 205 selects address/command serial bus 210 as the input to a Serial Interface Shift Register 214 in memory device 206, . . . , and MUX 207 selects address/command serial bus 210 as the input to Serial Interface Shift Register 216 in memory device 208. Thus, all of the memory devices are coupled to the address/command serial bus 210, and all memory devices receive the same address and command information without incurring a pipelining delay.

In a following time period the serial input of the memory devices are daisy-chained. The data bits from memory controller 202 are supplied on data path 230 to MUX 203 and selected for the input of Serial Interface Shift Register 212. Output data from Serial Interface Shift Register 212 is selected by MUX 205 to be supplied to an input of Serial Interface Shift Register 214. Further in the chain, an output from a previous Serial Interface Shift Register is selected by MUX 207 to be supplied to an input of Serial Interface Shift Register 216. The data output of Serial Interface Shift Register 216 in memory device 208 is connected via path 236 to a SPIO IN pin of serial memory controller 202.

In one time period, the host may read or write memory devices 204, 206, . . . , 208, by clocking the parallel-connected serial bus and providing the same address and command information to every serial part to circumvent the pipeline. In a succeeding time period, data is shifted in or out of the memory devices through the daisy-chain serial interface. To achieve higher throughput, it is possible for another embodiment to use additional serial masters. Also, several separate daisy-chain configurations could exist in parallel, while still sharing a single address/command serial master on the host controller, the resultant effect being a higher throughput of data for any given operation (read/write). Note that in this configuration the devices are in a state where any memory device can be individually accessed, and the trade-off of access-delay and flexibility can be completely managed by the host system software.

By now it should be apparent that embodiments of the present invention allow increased memory storage efficiencies by using features of the present invention. A method has been presented for connecting together memory devices that may be used in a high density memory system to reduce system cost and complexity. New architectures have been described that disconnect the address input from the chain altogether. This allows each memory device to receive the access address as if it were the only device in the chain, thus reducing the time required to input addresses into the memory devices by eliminating the serial address chain.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A system having a plurality of memory devices, the system comprising:
   a first memory device and a second memory device of the plurality of memory devices;
   a first shift register of the first memory device to receive serial address and command information at a first memory input pin of the first memory device, the first shift register being configured to couple in parallel to a first shift register of the second memory device and first shift registers of any other remaining memory devices of the plurality of memory devices to receive serial address and command information in parallel with the first shift register of the first memory device; and
   a second shift register of the first memory device to receive data only at a second memory input pin of the first memory device and shift the data to provide shifted data at a memory output pin of the first memory device, the shifted data from the memory output pin to be communicated to a second shift register of the second memory device.

2. The system of claim 1, wherein the memory input pin and the memory output pin are coupled to other memory devices to form a serial daisy-chain.

3. The system of claim 1, wherein the serial address and command information is configured to be received on a serial bus coupled in parallel that couples to each of the plurality of memory devices to circumvent pipeline timing delays.

4. The system of claim 1, wherein the memory is a Phase-Change Memory (PCM) device.

5. The system of claim 1, wherein the memory is a Conductive-Bridging Random Access Memory (CBRAM) device.

6. The system of claim 1, wherein the memory is a Ferroelectric Random Access Memory (FRAM) device.

7. The system of claim 1, wherein the first shift register and the second shift register are part of a Serial Peripheral Interface (SPI).

8. A memory card, comprising:
   a serial memory controller to provide an interface to a plurality of memory devices, the serial memory controller including an address and command bus, and a serial data output bus;
   a first memory device of the plurality of memory devices having a first shift register coupled to the address and command bus and a second shift register having an input coupled to the serial data output bus of the serial memory controller; and
   a second memory device of the plurality of memory devices having a first shift register coupled in parallel with the first shift register of the first memory device to the address and command bus and a second shift register having an input serially coupled to an output of the second shift register of the first memory device, an output of the second shift register being configured to provide a shifted serial data output of the second memory device.

9. The memory card of claim 8, wherein the address and command bus is a serial bus coupled in parallel that couples to other memory devices to circumvent pipeline timing delays.

10. The memory card of claim 8, wherein the second shift register of the first memory device and the second shift register of the second memory device are coupled in a serial daisy-chain.

11. A memory card, comprising:
   a serial memory controller to provide an interface to memory devices, the serial memory controller including an address and command bus, and a serial data output bus;
   a first memory device having a first multiplexer with a first input to receive serial information from the address and command bus and a second input to receive serial data from the serial data output from the serial memory controller, an output of the first multiplexer being coupled to a shift register in the first memory device; and
   a second memory device having a second multiplexer with a first input coupled in parallel with the first input of the first multiplexer, the first input of the second multiplexer to receive the serial information from the address and command bus, the second multiplexer further having a second input to receive an output from the shift register in the first memory device, an output of the second multiplexer being coupled to a shift register in the second memory device.

12. The memory card of claim 11, wherein the shift register in the first memory device is configured to receive either an address or a command from the address and command bus during a first time period and to receive data from the serial data output in a second time period subsequent to the first time period.

13. The memory card of claim 11, wherein the shift register in the second memory device is configured to receive either an address or a command from the address and command bus during a first time period and to receive data from the output of the shift register in the first memory device in a second time period.

* * * * *